US008115375B1

(12) United States Patent
Zhai et al.

(10) Patent No.: US 8,115,375 B1
(45) Date of Patent: Feb. 14, 2012

(54) CHROMATICITY TUNED SOLID STATE LIGHTING APPARATUS

(75) Inventors: Jinhui Zhai, Oldsmar, FL (US); Israel Morejon, Tampa, FL (US); Thong Bui, Tarpon Springs, FL (US); Evan O'Sullivan, Safety Harbor, FL (US)

(73) Assignee: LEDnovation, Inc., Tampa, FL (US)

( * ) Notice: Subject to any disclaimer, the term of this patent is extended or adjusted under 35 U.S.C. 154(b) by 416 days.

(21) Appl. No.: 12/390,747

(22) Filed: Feb. 23, 2009

(51) Int. Cl.
*H01L 00/50* (2006.01)

(52) U.S. Cl. .......................................... 313/498; 313/46

(58) Field of Classification Search ........... 313/498–512
See application file for complete search history.

(56) References Cited

U.S. PATENT DOCUMENTS

| | | | | |
|---|---|---|---|---|
| 6,495,964 | B1 | 12/2002 | Muthu et al. | |
| 7,061,454 | B2 | 6/2006 | Sasuga et al. | |
| 7,178,941 | B2 | 2/2007 | Roberge et al. | |
| 7,182,480 | B2 | 2/2007 | Kan | |
| 7,213,940 | B1 | 5/2007 | Van De Ven et al. | |
| 7,230,222 | B2 | 6/2007 | Cheng et al. | |
| 7,358,679 | B2 | 4/2008 | Lys et al. | |
| 7,387,405 | B2 | 6/2008 | Ducharme et al. | |
| 7,390,684 | B2 | 6/2008 | Izuno et al. | |
| 7,703,945 | B2 * | 4/2010 | Leung et al. | 362/246 |
| 2007/0145915 | A1 | 6/2007 | Roberge et al. | |
| 2007/0273290 | A1 | 11/2007 | Ashdown et al. | |
| 2007/0278974 | A1 | 12/2007 | Van De Ven | |

* cited by examiner

*Primary Examiner* — Anne Hines
(74) *Attorney, Agent, or Firm* — Ronald E. Smith; Smith & Hopen, P.A.

(57) ABSTRACT

A lighting apparatus includes at least one LED and a chromaticity tuning cavity adapted to capture light from the LED. The chromaticity tuning cavity is defined by a light translucent window and a plurality of backscattering light recycling surfaces. The light translucent window is adapted to backscatter at least a portion of the LED light. A preselected chromaticity tuning member is positioned within the chromaticity tuning cavity. It is selected from a group of chromaticity tuning members adapted to tune the chromaticity of various lighting apparatuses within one quadrangle on a chromaticity diagram. At least a portion of the LED light, having been backscattered and tuned by the preselected tuning member, passes through the light translucent window as warm white extraction light.

28 Claims, 5 Drawing Sheets

CHROMATICITY TUNED SOLID STATE LIGHTING APPARATUS

FIELD OF THE INVENTION

This invention relates, generally, to solid state lighting device, as well as related apparatus and methods. More particularly, it relates to methods for tuning the chromaticity of a solid state lighting apparatus and to a method for making the apparatus.

DESCRIPTION OF THE PRIOR ART

Incandescent light bulbs are very energy inefficient light sources; about ninety percent (90%) of the electricity they consume is released as heat rather than light. Fluorescent light bulbs are about ten (10) times more efficient. Solid state semiconductor emitters, such as light emitting diodes, are about twice as efficient as Fluorescent light bulbs.

Moreover, incandescent light bulbs have relatively short lifetimes of about 750-1000 hours. Fluorescent bulbs have longer lifetime of about 10,000-20,000 hours, but they contain mercury, not an environment friendly light source, and it provides less favorable color reproduction. Light emitting diodes have lifetimes of about 50,000-75,000 hours. Furthermore, solid state light emitters are very clean "green" light source and it can achieve very good color reproduction.

Accordingly, for these and other reasons, efforts have been ongoing to develop solid state lighting devices to replace incandescent light bulbs, fluorescent lights and other light-generating devices in a wide variety of applications. In addition, where light emitting diodes or other solid state light emitters are already being used, efforts are ongoing to provide improvement with respect to energy efficiency, luminance level and distribution, and lighting quality including appearance, color rendering (CRI Ra), and color consistency, especially for indoor applications.

Almost all the known light emitting semiconductor devices utilizing blue LEDs and phosphors in combination to obtain color-mixed light of the emission light from the blue LEDs and the excitation light from the phosphors use YAG-based or silicate-based luminescent layers as phosphors. Those solid state lighting devices have white color temperatures of about 5000K-8500K and a low color rending index Ra of about 60~70. Conventional solid state warm white lighting devices are realized by adding orange or red phosphors into yellow or green phosphors to adjust the color temperature less than 4000K with a color rendering index of about 70~80. However, there is a large variation in chromaticity coordinates and shift between the fixtures and for the life time of the fixtures caused by: a) different batches of blue LEDs having different wavelengths and lumens output; b) variable amounts of primary blue light being converted to yellow light or a mixture of green/orange light in each white LED; c) variable mixing ratios of green and orange phosphor; d) variable wavelength conversion efficiencies from different phosphor providers; and e) chromaticity shifts over the life time of phosphor-converted white LEDs.

American National Standard Lighting Group publishes American National Standard ANSI_NEMA_ANSIG C78.377-2008 entitled: "Specifications for the Chromaticity of Solid State Lighting Products" to specify the range of chromaticities recommended for general lighting with solid state lighting (SSL) products, as well as to ensure that the white light chromaticities of the products can be communicated to consumers. The SSL products covered in this standard have chromaticity values that fall into one of the normal correlated color temperature (CCT) categories defined by target CCT and tolerance (K).

One way to ensure that chromaticity coordinates of the lighting fixtures fall into one quadrangle is to use control electronics to actively control the driving current of the lighting fixtures with multi-spectrum semiconductor light emitters. The control electronics includes a color control sensor and closed-loop control electronics. That approach increases the complexity and cost of light fixture electronics.

Another way to ensure that chromaticity coordinates fall into one quadrangle for the lighting fixtures with white LED only is to narrow the white LED bins. This results in a low yield and high cost LED.

There remains a need, therefore, for a cost-effective solution to ensure that chromaticity coordinates of the lighting fixtures fall into one quadrangle for each nominal CCT category as shown in a standard chromaticity diagram, which has utility for both a lighting fixture with multi-spectrum semiconductor light emitters and a lighting fixture with white LEDs only.

There is also a need to avoid closed-loop control electronics with a complex multi-strings driver design and to widen the acceptable bins of white LEDs for increasing the yield and reduce the cost of white LEDs.

There is a further need to ensure that chromaticity coordinates fall into one quadrangle over the life time of a lighting fixture.

However, in view of the prior art taken as a whole at the time the present invention was made, it was not obvious to those of ordinary skill how the identified needs could be fulfilled.

SUMMARY OF THE INVENTION

The long-standing but heretofore unfulfilled need for a chromaticity tuned LED lighting apparatus and cost-effective manufacturing method that ensures the chromaticity coordinates of the lighting apparatuses will fall into one quadrangle on a specific chromaticity diagram during a manufacturing process and over the lifetime of the apparatus is now met by a new, useful, and non-obvious invention.

In a first embodiment, the inventive lighting apparatus includes a chromaticity tuning cavity defined by a light translucent window and a plurality of backscattering light recycling surfaces. The light translucent window may be adapted to provide a hazing effect to diffuse the extracted light. Moreover, the light translucent window may also include a plurality of luminescent particles dispersed into a transparent resin to diffuse the extracted light as well as to convert the wavelength of primary light into a longer wavelength.

At least one LED is positioned within the chromaticity tuning cavity. The backscattering light recycling surfaces are adapted to capture the backscattering light from the at least one LED and the light translucent window is adapted to extract the LED light and also to backscatter at least a portion of the LED light.

A preselected chromaticity tuning member is positioned within the chromaticity tuning cavity. It is selected during the manufacturing process from a group of chromaticity tuning members adapted to tune the chromaticity of various lighting apparatuses within one quadrangle on a 1931 CIE chromaticity diagram, hereinafter referred to as the chromaticity diagram.

A chromaticity tuning member is a separated luminescent sheet positioned in overlying relation to at least a portion of the backscattering light recycling reflector member. The chromaticity tuning member absorbs a portion of backscattering primary blue LED light and converts it into secondary spectrum light. The secondary spectrum light is adapted to slightly shift the chromaticity coordinates of the lighting apparatus on the chromaticity diagram.

Each group of chromaticity tuning members includes various reddish orange wavelength conversion sheets, green wavelength conversion sheets, and yellow wavelength conversion sheets. Each of the lighting apparatuses is manufactured by selecting a specific chromaticity tuning luminescent sheet from a group of chromaticity tuning members to shift its chromaticity coordinates towards to a specific area of one quadrangle on the chromaticity diagram.

The separated luminescent sheet is selected from a group of sheets including a polymer phosphor film, a luminescent ceramic sheet and an organic dye sheet.

The chromaticity tuning member may also be laminated or otherwise deposited onto an interior surface of the light translucent window and is adapted to absorb primary blue light and convert it into a reddish orange light, a green light, and a yellow light, to shift the chromaticity coordinates of the lighting apparatus to tune the chromaticity coordinates within one quadrangle on the chromaticity diagram.

The selected chromaticity tuning member is laminated onto the light translucent window and is adapted to adjust the chromaticity coordinates of the lighting apparatus back to its original chromaticity over the life time of the lighting apparatus.

The chromaticity tuning member may be a separated color filter sheet disposed in overlying relation to a preselected backscattering light recycling reflector surface. The chromaticity tuning member is adapted to absorb at least a portion of one spectrum light from the backscattering light to tune the chromaticity of the lighting apparatus. The group of chromaticity tuning members includes green color filters, yellow color filters and reddish orange color filters so that the lighting apparatus includes a specific chromaticity tuning color filter sheet selected from the group of chromaticity tuning members to shift its chromaticity coordinates towards a specific area of one quadrangle on the chromaticity diagram. Accordingly, multiple lighting apparatuses may include differing chromaticity tuning color filter sheets.

The novel light apparatus further includes a thermally conductive heat sink body having a hollow interior. An inverter for converting AC-to-DC is disposed external to the chromaticity tuning cavity in the hollow interior of the light apparatus heat sink body and said inverter is in electrical communication with the at least one LED.

All embodiments of the novel apparatus include a thermally conductive heat sink body, an inverter, and a mounting socket adapted to provide electrical communication between an AC power source and the inverter.

A second embodiment includes a plurality of semiconductor light emitters adapted to emit a primary blue light. At least one luminescent material is deposited in overlying relation to at least one semiconductor light emitter and is adapted to absorb at least a portion of the primary blue light and to excite a second yellow light. The primary blue light that is not absorbed is defined as leaked primary blue light; said leaked primary blue light combines with the excited second yellow light to produce a white light.

In a variation of the second embodiment, a plurality of semiconductor light emitters is adapted to emit a primary blue light and a second reddish orange light. At least one luminescent material is deposited in overlying relation to the blue light emitters and is adapted to absorb at least a portion of the primary blue light and to excite a third yellow light. The combination of reddish orange light, leaked primary blue light and excited second yellow light produce a warm white light.

In the second embodiment, the chromaticity tuning cavity, the light translucent output window, the thermal heat sink body, and the mounting socket collectively have a light bulb shape such as an A19 incandescent bulb shape. However, the second embodiment may also include a flat light translucent output window as in the first embodiment.

In a third embodiment, a plurality of semiconductor light emitters includes a first group of semiconductor light emitters adapted to emit primary blue light and a second group of semiconductor light emitters adapted to emit a second reddish orange light. The semiconductor light emitters of the first group of semiconductor light emitters are circumferentially spaced apart from one another and the semiconductor light emitters of the second group of semiconductor light emitters are circumferentially spaced apart from one another. The first group is positioned radially outwardly of the second group.

Another variation includes a plurality of semiconductor light emitters adapted to emit a primary blue light, a second reddish orange light and a third green light. At least one luminescent material is deposited in overlying relation to the blue light emitters and is adapted to absorb at least a portion of primary blue light and excite a fourth yellow light. The combination of reddish orange light, orange leaked primary blue light and excited second yellow light is adapted to produce a warm white light with a high color rendering index.

The third embodiment may include a chromaticity tuning cavity enclosed by a flat light translucent output window as in the first embodiment or a dome-shaped light translucent output window as in the second embodiment. Both windows are adapted to backscatter at least a portion of LED light.

A fourth embodiment includes a first group of circumferentially spaced apart semiconductor light emitters mounted on a thermally conductive substrate to emit a primary blue light and to excite a yellow light, a second group of circumferentially spaced apart semiconductor light emitters mounted on the thermally conductive substrate to emit a reddish orange light, and a third group of circumferentially spaced apart semiconductor light emitters mounted on the thermally conductive substrate to emit a green light. The first group is positioned radially outwardly of the second group and the second group is positioned radially outwardly of the third group.

In a variation of the fourth embodiment, a plurality of semiconductor light emitters includes a first group of semiconductor light emitters adapted to emit primary blue light, a second group of semiconductor light emitters adapted to emit a second reddish orange light and a third group of semiconductor light emitters adapted to emit a third green light. The emitters of the first group of semiconductor light emitters are circumferentially spaced apart from one another, the emitters of the second group of semiconductor light emitters are circumferentially spaced apart from one another, and the emitters of the third group of semiconductor light emitters are circumferentially spaced apart from one another. The first group is positioned radially outwardly of the second group and the second group is positioned radially outwardly of the third group.

The fourth embodiment may include a chromaticity tuning cavity enclosed by a flat light translucent output window as in the first embodiment or a dome-shaped light translucent output window as in the second embodiment. Both windows are adapted to backscatter at least a portion of LED light.

In a fifth embodiment, a plurality of semiconductor light emitters is mounted in circumferentially spaced relation to one another around an interior annual sidewall of the chromaticity tuning cavity in encircling relation to the light redirection reflective member. The plurality of semiconductor light emitters includes at least two groups of semiconductor light emitters and at least one luminescent material. More particularly, the plurality of semiconductor light emitters includes a first group of semiconductor blue light emitters and a second group of reddish orange light emitters. The at least one luminescent material is a yellow phosphor deposited onto the first group of semiconductor blue light emitters to excite a yellow light.

In all embodiments, the novel chromaticity tuning cavity may have a frusto-conical configuration including a flat thermally conductive substrate, a reflective frusto-conical heat sink wall and a translucent output window having a flat or dome shape. The reflective frusto-conical sink wall deflects wide-angle emitting light from the semiconductor light emitter or emitters into a forward-transferred light.

The light translucent output window backscatters at least a portion of primary blue light. A light recycling reflective sheet that may take the form of a diffusive reflector is disposed in overlying relation to the frusto-conical heat sink wall. The thermally conductive substrate is positioned around and between a plurality of semiconductor light emitters to recycle the backscattering light.

In all embodiments, a preselected chromaticity tuning member in the form of a luminescent sheet is positioned within the chromaticity tuning cavity and performs the function of absorbing a portion of primary blue LED light and converting it to secondary spectrum light adapted to slightly shift the chromaticity coordinates of the lighting apparatus and to improve its color rendering characteristics. A set of said chromaticity tuning members is provided so that individual tuning members may be selected during the manufacturing process to tune the chromaticity of various lighting apparatuses within one quadrangle on the chromaticity diagram.

The preselected chromaticity tuning member may be positioned in overlying relation to a backscattering light recycling reflector surface.

The chromaticity tuning member positioned within the chromaticity tuning cavity absorbs a portion of primary blue LED light and converts it to secondary spectrum light. The secondary spectrum light is adapted to slightly shift the chromaticity coordinates of the lighting apparatus. In all embodiments, the chromaticity tuning member is selected, during the manufacturing of the lighting apparatus, from a set of said chromaticity tuning members adapted to tune the chromaticity of various lighting apparatuses within one quadrangle on the chromaticity diagram.

All embodiments include an electrical AC-to-DC inverter disposed external to the chromaticity tuning cavity and internally of the light apparatus heat sink body, in electrical communication with at least one LED. All embodiments include at least one mounting socket adapted to mechanically and electrically engage an Edison-mount screw-type light bulb socket, a fluorescent tube coupler arrangement, and a halogen MR-16 socket arrangement. The mounting socket is in electrical communication with the AC-to-DC inverter.

The novel manufacturing process includes the steps of packaging an LED board into a light apparatus mechanical body, recording the chromaticity coordinates of the packaged lighting apparatus, selecting a chromaticity tuning sheet from a set of chromaticity tuning members according to the recorded chromaticity coordinates, mounting a chromaticity tuning sheet and output window onto the lighting apparatus, and comparing the chromaticity coordinates of the assembled lighting apparatus to predetermined values. If the chromaticity coordinates fall outside of the predetermined values, the steps further include changing the chromaticity tuning sheet based on the difference between its chromaticity coordinates and the predetermined values to shift the chromaticity coordinates of the lighting apparatus into a predetermined area on the chromaticity diagram, and repeating that step as needed. If the chromaticity coordinates fall within the predetermined values, the lighting apparatus is sent to product testing.

The primary object of the invention is to provide a chromaticity tuned solid state lighting apparatus without having active closed-loop control electronics.

Another object is to widen the acceptable bins of semiconductor light emitters.

Another important object is to provide a novel manufacturing procedure for making the novel lighting apparatus.

These and other important objects, advantages, and features of the invention will become clear as this description proceeds.

The invention accordingly comprises the features of construction, combination of elements, and arrangement of parts that will be exemplified in the description set forth hereinafter and the scope of the invention will be indicated in the claims.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

Figure 1:
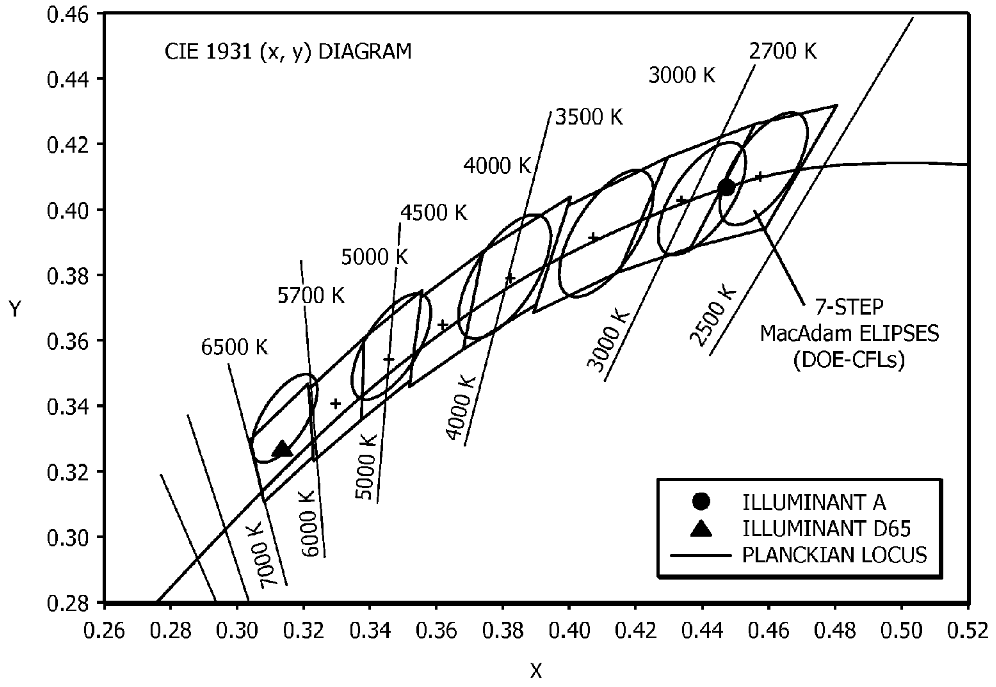
FIG. 1 is a chromaticity diagram.

FIG. 1 is a graphical representation of the chromaticity specification of SSL products on the CIE 1931 (x,y) chromaticity diagram defined by American National Standard Lighting Group in "ANSI_NEMA_ANSLG C78.377-2008." The graphic includes eight (8) nominal CCT categories with given chromaticity tolerances. The chromaticity tolerance ranges are represented by quadrangles that are mostly overlapping with the 7-step macadam ellipses defined in the CFL Energy Star specification (version 4.0) for the six nominal CCTs.

Figure 2:
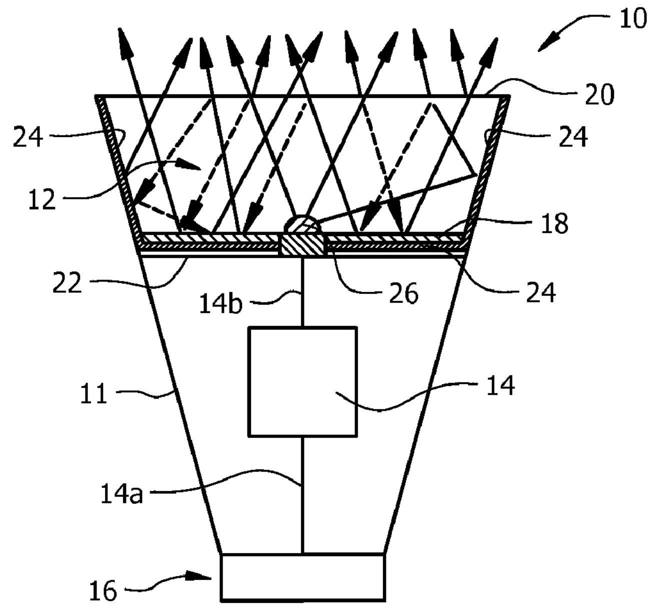
FIG. 2 is a sectional view in side elevation of a first embodiment.

Referring now to FIG. 2, there it will be seen that a first embodiment of lighting apparatus 10 includes thermal conductive body 11 having a hollow interior and chromaticity tuning cavity 12 that also defines a hollow interior. Inverter 14 is disposed within said thermally conductive body 11, i.e., external to said chromaticity tuning cavity 12 and is electrically connected by conductor **14*a* to power connector base 16, also known as mounting socket 16. Inverter 14 is also electrically connected by conductor 14*b* to semiconductor light emitter 26 that is disposed within chromaticity tuning cavity 12**.

Chromaticity tuning cavity 12 is enclosed at its upper end by light translucent output window 20 having a flat configuration and at its lower end by thermal conductive substrate 22 that underlies backscatter recycling reflector 24. The interior sidewalls of chromaticity tuning cavity 12 are also backscattering light recycling surfaces that perform the same function as backscatter recycling reflector 24. In this embodiment, both thermal conductive body 11 and chromaticity tuning chamber 12 have a frusto-conical configuration. That shape has utility because it allows the light rays from LED 26 to diverge as depicted in FIG. 2.

At least one semiconductor light emitter 26 is packaged on thermal conductive substrate 22 in this first embodiment to emit a first light. Light translucent output window 20 diffuses the output light and also backscatters at least a portion of the first light.

Forward diffusing light is indicated by solid lines and backscattering light is indicated in dashed lines.

In all embodiments, chromaticity tuning member 18 absorbs the backscattering first light and converts it into a specific second light to tune the output light color temperature from lighting apparatus 10. Chromaticity tuning member 18 is switchable to tune the chromaticity coordinates of light apparatus 10 within one quadrangle on the 1931 CIE chromaticity diagram for each nominal CCT depicted in FIG. 1 during the manufacturing process of lighting apparatus 10.

Figure 3:
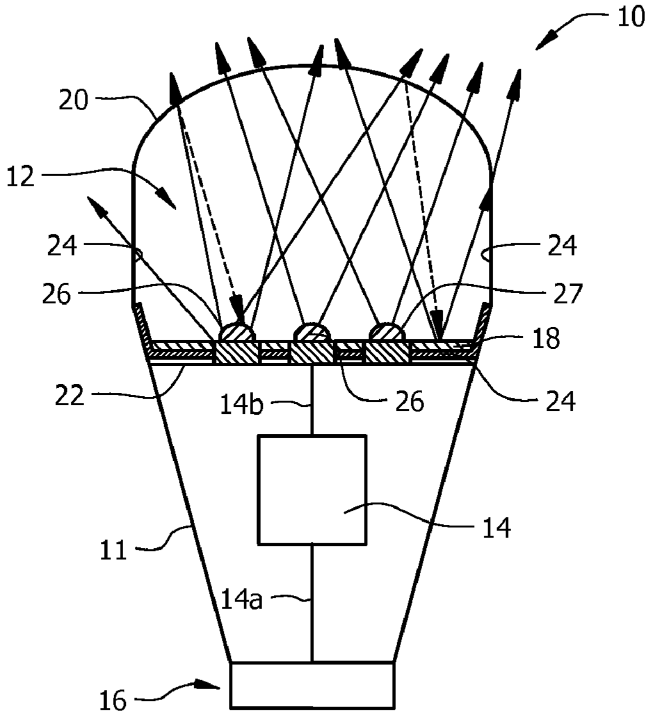
FIG. 3 is a sectional view in side elevation of a second embodiment.

As depicted in FIG. 3, a second embodiment of lighting apparatus 10 may include a dome-shaped light output window 20, a plurality of semiconductor light emitters 26, and at least one luminescent material 27 deposited in overlying elation to its associated light emitter. A plurality of semiconductor light emitters 26 emits a primary blue light. At least one luminescent material 27 is deposited on top of the emitters 26 to absorb at least a portion of primary blue light and excite a second yellow light. The combination of leaked primary blue light and excited second yellow light produces a white light. The plurality of semiconductor light emitters 26 may include a group of reddish orange semiconductor light emitters. The plurality of semiconductor light emitters 26 may also include a group of reddish orange semiconductor light emitters and a group of green semiconductor light emitters to improve the color rendering index of the lighting apparatus depicted in FIG. 3. Multi-spectrum light is also mixed inside chromaticity tuning cavity 12 before said multi-spectrum light is extracted from lighting apparatus 10.

Light translucent output window 20 may be a transparent component to extract light having a hazing effect. Light translucent output window 20 may be made from a transparent resin dispersed with a plurality of luminescent particles. The luminescent particles diffuse the extraction light and convert a portion of the first light into a specific second light to adjust the chromaticity of the output light. Light translucent output window 20 may have a flat configuration as in the embodiment depicted in FIG. 2 or it may have a globe shape like a conventional incandescent light bulb as in the embodiment depicted in FIG. 3. The shape or size of light translucent window 20 is not limited to the two (2) examples provided.

Chromaticity tuning member 18 may be a separate polymer phosphor film, a luminescent ceramic sheet, or an organic dye sheet. Chromaticity tuning member 18 may be disposed in overlying relation to backscattering light recycling reflector surface 24 so that it is positioned between and around semiconductor light emitters 26 as depicted in FIG. 3.

In all embodiments, a set of chromaticity tuning members is provided to shift the chromaticity coordinates of the lighting apparatus which is outside of the quadrangle for each nominal CCT shown in FIG. 1 towards a specific area inside the quadrangle during the novel manufacturing process.

Figure 4A:
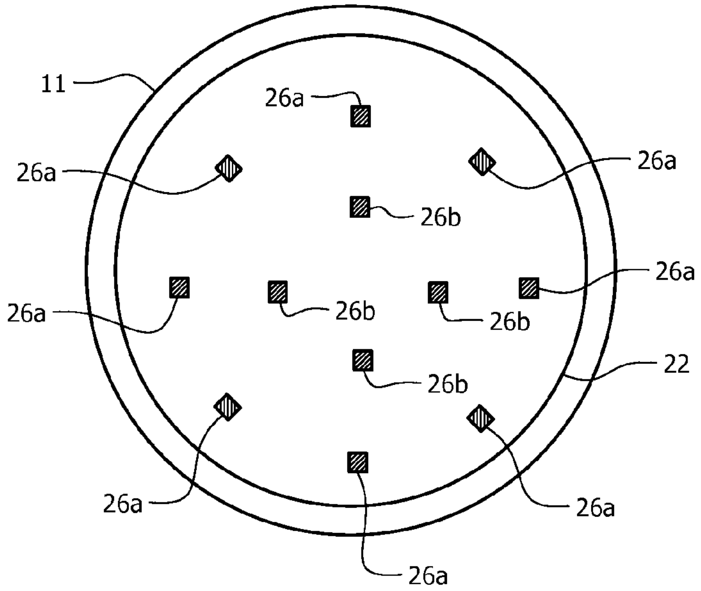
FIG. 4A is a sectional, top plan view of a third embodiment.

FIG. 4A depicts a third embodiment having a first and second plurality of semiconductor light emitters 26*a* and 26*b* mounted on thermally conductive substrate 22. These groups of semiconductor light emitters 26*a* and 26*b* are adapted to emit multi-spectrum light to produce a high color rendering light.

More particularly, semiconductor light emitters 26*a* are adapted to emit primary blue light and semiconductor light emitters 26*b* are adapted to emit a second reddish orange light. The first group of semiconductor light emitters 26*a* includes a first plurality of light emitters that are circumferentially spaced apart from one another and the second group of semiconductor light emitters includes a second group of light emitters that are circumferentially spaced from one another. The first group of light emitters 26*a* is positioned radially outwardly of the second group of light emitters 26*b*.

Figure 4B:
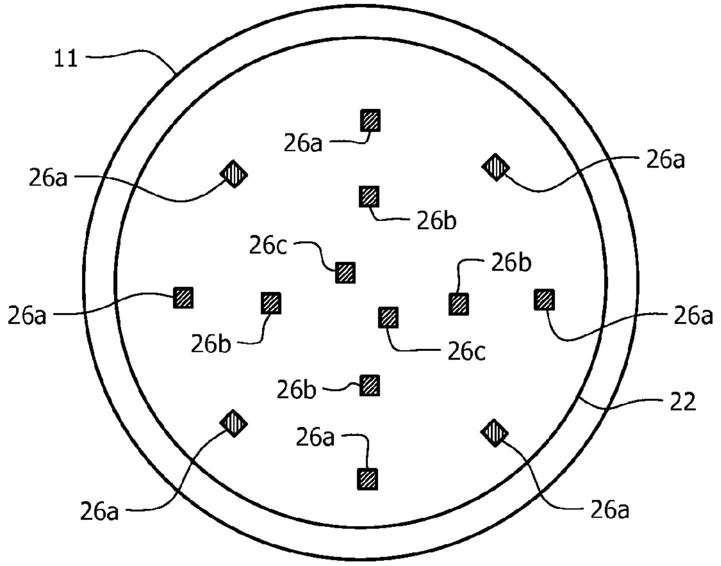
FIG. 4B is a sectional, top plan view of a fourth embodiment.

FIG. 4B depicts a fourth embodiment having three (3) groups of concentric semiconductor light emitters. The first group includes a plurality of circumferentially spaced apart semiconductor light emitters 26*a* adapted to emit primary blue light, the second group includes a plurality of circumferentially spaced apart semiconductor light emitters 26*b* adapted to emit a second reddish orange light and the third group includes a plurality of circumferentially spaced apart semiconductor light emitters 26*c* adapted to emit a green light. Light emitters 26*a* are disposed radially outwardly of light emitters 26*a* and 26*b*. Light emitters 26*b* are disposed radially outwardly of light emitters 26*c*.

Figure 5:
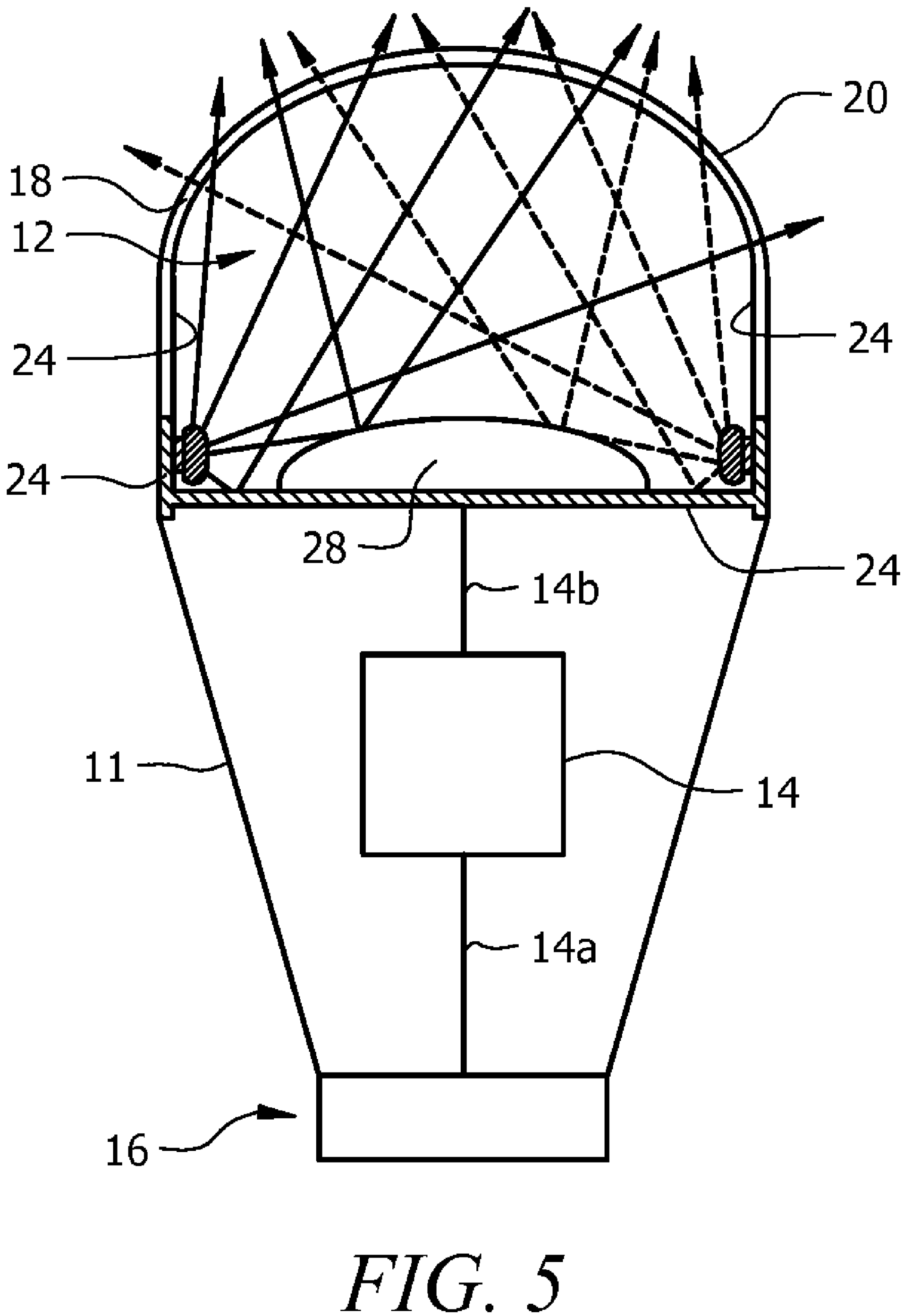
FIG. 5 is a sectional view in side elevation of a fifth embodiment.

The fifth embodiment of FIG. 5 includes a plurality of semiconductor light emitters 26 mounted about the periphery of interior annular sidewall 24 of chromaticity tuning cavity 12. The plurality of semiconductor light emitters includes at least two groups of semiconductor light emitters and at least one luminescent material.

Highly reflective member 28, also known as center diffusive reflection dome, has a generally convex shape and is disposed in overlying relation to horizontal backscatter recycling reflector 24 that forms the floor of chromaticity tuning cavity 12. Highly reflective member 28 and said horizontal backscatter recycling reflector 24 cooperate to redirect light from said semiconductor light emitters into a forward light as indicated by the solid light ray lines in FIG. 5.

Lighting apparatus 10 further includes a conventional Edison-mount socket 16 adapted to be connected to an AC power base. Light apparatus 10 has a conventional A19 bulb shape in this embodiment but the invention is not limited to such shape.

Although some of the emitted and/or excited light from the semiconductor light emitters is directly forward propagated through chromaticity tuning cavity 12 as indicated by the solid light ray lines in FIG. 5 as aforesaid, some of the emitted or excited light from said semiconductor light emitters is randomly redirected by center diffusive reflection dome 28 into chromaticity tuning cavity 12 and is thoroughly mixed with the directly forward propagated light from the other lighting emitters.

Chromaticity tuning member 18 may be laminated or coated onto an interior surface of light output window 20. Chromaticity tuning member 18 is adapted to absorb a portion of a first light and convert it into a specific second light to adjust the chromaticity of the lighting apparatus.

A set of output windows onto which different chromaticity tuning members 18 are laminated or coated may be provided to shift the chromaticity coordinates of the lighting apparatus that are outside of the quadrangle for each nominal CCT shown in FIG. 1 towards a specific area inside the quadrangle on said chromaticity diagram during the novel manufacturing process.

Figure 6:
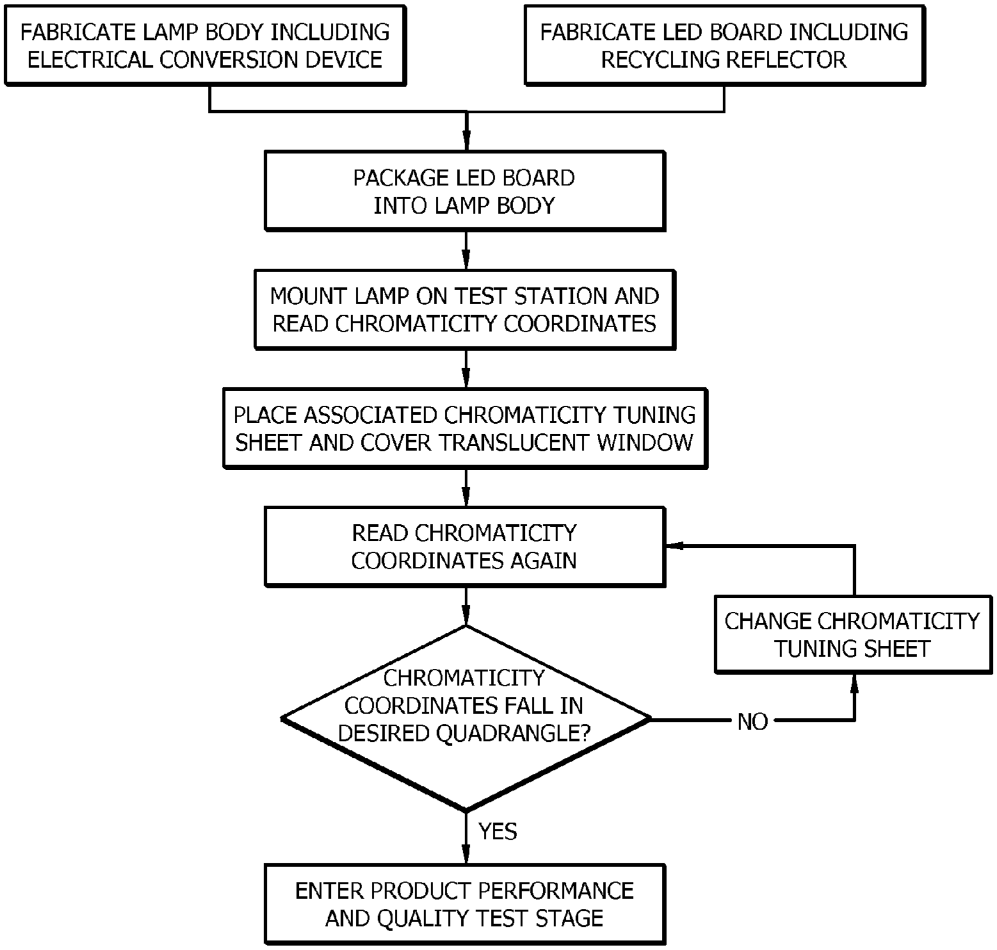
FIG. 6 is a flow chart of a manufacturing process for making the various embodiments.

FIG. 6 is a flowchart of the novel manufacturing process for tuning the chromaticity of lighting apparatus 10.

The first step is to fabricate the mechanical body of light apparatus 10, including thermally conductive body 11, chromatic tuning cavity 12, and inverter 14 that is housed within said mechanical body. The LED board with recycling reflector 24 is fabricated at the same time.

The second step is to package the LED board into overlying relation to thermally conductive body 11.

The third step is to mount lighting apparatus 10 onto a test stage and to read and record its chromaticity coordinates.

The fourth step is to select a chromaticity tuning sheet from a set of chromaticity tuning members 18, said selection being guided by the chromaticity coordinates observed and recorded in the third step.

The fifth step is to mount the selected chromaticity tuning sheet onto the lighting apparatus to cover translucent output window 20 and to observe and record the chromaticity coordinates of the lighting apparatus again to determine if said coordinates fall onto or outside a specific area inside the quadrangle as depicted in FIG. 1.

The selected chromaticity tuning sheet may also be mounted in overlying relation to the LED board including recycling reflector 24, followed by observing and recording the chromaticity coordinates of the lighting apparatus again to see if said coordinates fall onto or outside a specific area inside the quadrangle as depicted in FIG. 1.

If the chromaticity coordinates fall onto a specific area inside the quadrangle, there is no further need to test any further chromatic tuning sheets. The product is therefore tested for performance and quality.

If the chromaticity coordinates fall onto a specific area outside the quadrangle, a different chromaticity tuning sheet is selected based on the variation or difference between the observed chromaticity coordinates and the predetermined values and the chromaticity coordinates are read and recorded again. This process is repeated until the chromaticity falls onto a specific area inside the quadrangle for each nominal CCT shown in FIG. 1. When the chromaticity falls onto an acceptable specific area inside the quadrangle for each nominal CCT shown in FIG. 1, the product is then tested for performance and quality.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A lighting apparatus, comprising:

at least one LED;

a chromaticity tuning cavity adapted to capture light from said at least one LED;

said chromaticity tuning cavity defined by a light translucent window and a plurality of backscattering light recycling surfaces;

said light translucent window adapted to backscatter at least a portion of said LED light;

a preselected chromaticity tuning member positioned within said chromaticity tuning cavity;

said preselected chromaticity tuning member being selected from a group of chromaticity tuning members adapted to tune the chromaticity of various lighting apparatuses within one quadrangle on a chromaticity diagram; and at least a portion of said LED light, having been backscattered and tuned by said preselected tuning member, passing through said light translucent window as extraction light.

2. The lighting apparatus of claim 1, further comprising:

a thermal conductive heat sink body having a hollow interior;

an inverter disposed external to said cavity in said hollow interior of said thermal conductive heat sink body;

said inverter being in electrical communication with said at least one LED; and a mounting socket adapted to provide electrical communication between an AC power source and said inverter.

3. The lighting apparatus according to claim 2, further comprising:

said mounting socket adapted to mechanically and electrically engage a conventional Edison-mount screw-type light bulb socket, a fluorescent tube coupler arrangement, and a halogen MR-16 socket arrangement.

4. The lighting apparatus according to claim 2, further comprising:

said chromaticity tuning cavity, said light apparatus thermal conductive heat sink body and said mounting socket collectively forming a light bulb shape.

5. The lighting apparatus according to claim 4, further comprising:

said light bulb shape being an A19 incandescent bulb shape.

6. The lighting apparatus according to claim 1, further comprising:

said at least one LED including a plurality of semiconductor light emitters and at least one luminescent material;

said plurality of semiconductor light emitters adapted to emit a primary blue light;

at least one luminescent material deposited in overlying relation to at least one of said semiconductor light emitters and adapted to absorb at least a portion of said primary blue light, thereby leaking at least a portion of said primary blue light, and to excite a second yellow light;

said leaked primary blue light and excited second yellow light combining to produce a white light.

7. The lighting apparatus according to claim 1, further comprising:

said at least one LED including a plurality of semiconductor light emitters;

at least one luminescent material deposited in overlying relation to at least one semiconductor light emitter of said plurality of semiconductor light emitters;

said plurality of semiconductor light emitters adapted to emit a primary blue light and a second reddish orange light;

at least one luminescent material deposited in overlying relation to said blue light emitters and adapted to absorb at least a portion of primary blue light, thereby leaking a portion of said primary blue light, and to excite a third yellow light;

said combination of reddish orange light, leaked primary blue light and excited second yellow light adapted to produce a warm white light.

8. The lighting apparatus according to claim 1, further comprising:

said at least one LED including a plurality of semiconductor light emitters;

said plurality of semiconductor light emitters including a first group of semiconductor light emitters adapted to emit primary blue light and a second group of semiconductor light emitters adapted to emit a second reddish orange light;

the semiconductor light emitters of said first group of semiconductor light emitters being circumferentially spaced apart from one another; and the semiconductor light emitters of said second group of semiconductor light emitters being circumferentially spaced apart from one another; and said first group of semiconductor light emitters being disposed radially outwardly of said second group of semiconductor light emitters.

9. The lighting apparatus according to claim 1, further comprising:

said at least one LED including a plurality of semiconductor light emitters;

said plurality of semiconductor light emitters including at least one luminescent material disposed in overlying relation to at least one of said semiconductor light emitters;

said plurality of semiconductor light emitters adapted to emit a primary blue light, a second reddish orange light and a third green light;

at least one luminescent material deposited in overlying relation to said blue light emitters being adapted to absorb at least a portion of primary blue light, to leak at least a portion of said primary blue light, and to excite a fourth yellow light; and said combination of reddish orange light, leaked primary blue light, excited second yellow light and third green light adapted to produce a warm white light with a high color rendering index.

10. The lighting apparatus according to claim 1, further comprising:

said at least one LED including a plurality of semiconductor light emitters;

said plurality of semiconductor light emitters including a first group of semiconductor light emitters adapted to emit primary blue light, a second group of semiconductor light emitters adapted to emit a second reddish orange light and a third group of semiconductor light emitters adapted to emit a third green light;

said first group of semiconductor light emitters being circumferentially spaced apart from one another;

said second group of semiconductor light emitters being circumferentially spaced apart from one another;

said third group of semiconductor light emitters being circumferentially spaced apart from one another;

said first group of semiconductor light emitters being disposed radially outwardly of said second group of semiconductor light emitters and said second group of semiconductor light emitters being disposed radially outwardly of said third group of semiconductor light emitters.

11. The lighting apparatus according to claim 1, further comprising:

said chromaticity tuning cavity having a frusto-conical configuration including a flat thermal conductive substrate, a reflective frusto-conical heat sink wall and a translucent output window having a dome shape;

said at least one LED including a plurality of semiconductor light emitters;

said plurality of semiconductor light emitters mounted on said flat thermal conductive substrate;

said backscattering light recycling reflector surface disposed in overlying relation to said flat thermal conductive substrate and between said plurality of semiconductor light emitters; and said reflective frusto-conical sink wall deflecting wide-angle emitting light from said plurality of semiconductor light emitters into a forward-transferred light.

12. The lighting apparatus according to claim 1, further comprising:

said light translucent window adapted to provide a hazing effect to diffuse said extraction light.

13. The lighting apparatus according to claim 1, further comprising:

said light translucent window including plurality of luminescent particles dispersed into a transparent resin to diffuse the extraction light as well as to convert the wavelength of primary light into a longer wavelength light.

14. The lighting apparatus according to claim 1, further comprising:

said chromaticity tuning member being a separated luminescent sheet positioned in overlying relation to a preselected backscattering light recycling reflector surface;

said chromaticity tuning member adapted to absorb a portion of primary LED light and convert it into secondary spectrum light;

said secondary spectrum light adapted to slightly shift the chromaticity coordinates of said lighting apparatus on said chromaticity diagram; and said group of chromaticity tuning members including reddish orange wavelength conversion sheets, green wavelength conversion sheets, yellow wavelength conversion sheets;

whereby said lighting apparatus includes a specific chromaticity tuning luminescent sheet selected from said group of chromaticity tuning members to shift its chromaticity coordinates towards to a specific area of one quadrangle on said chromaticity diagram so that multiple lighting apparatuses may include differing chromaticity tuning luminescent sheets.

15. The lighting apparatus according to claim 14, further comprising:

said separated luminescent sheet being selected from a group of sheets including a polymer phosphor film, a luminescent ceramic sheet and an organic dye sheet.

16. The lighting apparatus according to claim 1, further comprising:

a preselected chromaticity tuning member being deposited onto an interior surface of said light translucent window;

said preselected chromaticity tuning member adapted to absorb primary blue light and convert said primary blue light into a reddish orange light, or a green light, or a yellow light, to thereby shift the chromaticity coordinates of said lighting apparatus.

17. The lighting apparatus according to claim 16, further comprising:

said preselected chromaticity tuning member being laminated onto said light translucent window.

18. The lighting apparatus according to claim 16, further comprising:

said preselected chromaticity tuning member adapted to adjust the chromaticity coordinates of said lighting apparatus back to its original chromaticity over a life time of said lighting apparatus.

19. The lighting apparatus according to claim 1, further comprising:

said chromaticity tuning member being a separated color filter sheet disposed in overlying relation to at least one backscattering light recycling reflector surface of said plurality of backscattering light recycling reflector surfaces;

said chromaticity tuning member adapted to absorb at least a portion of one spectrum light from backscattering light to tune the chromaticity of said lighting apparatus; and said group of chromaticity tuning members including green color filters, yellow color filters and reddish orange color filters;

whereby said lighting apparatus includes a specific chromaticity tuning color filter sheet selected from said group of chromaticity tuning members to shift its chromaticity coordinates towards a specific area of one quadrangle on said chromaticity diagram so that multiple lighting apparatuses may include differing chromaticity tuning color filter sheets.

20. A lighting apparatus, comprising:

at least one LED a thermally conductive substrate;

a first group of semiconductor light emitters mounted on said thermally conductive substrate and adapted to emit a primary blue light and to excite a yellow light;

a second group of semiconductor light emitters mounted on said thermally conductive substrate and adapted to emit a reddish orange light;

a third group of semiconductor light emitters mounted on said thermally conductive substrate and adapted to emit a green light;

a dome-shaped light translucent window;

a heat sink body including a frusto-conical heat sink wall;

a chromaticity tuning cavity enclosed by said dome shaped light translucent window, said frusto-conical heat sink wall and said thermally conductive substrate;

said light translucent window adapted to backscatter at least a portion of said primary blue light;

a light recycling reflective sheet disposed in overlying relation to said frusto-conical heat sink wall and said thermally conductive substrate between said semiconductor light emitters to recycle backscattered light;

a preselected chromaticity tuning member positioned within said chromaticity tuning cavity, said chromaticity tuning member adapted to absorb a portion of said primary LED light and to convert it to secondary spectrum light, said secondary spectrum light adapted to slightly shift chromaticity coordinates of said lighting apparatus;

said preselected chromaticity tuning member being selected from a set of said chromaticity tuning members adapted to tune the chromaticity of various lighting apparatuses within one quadrangle on a 1931 CIE chromaticity diagram;

an inverter disposed external to said chromaticity tuning cavity and inside said heat sink body, said inverter being in electrical communication with said at least one LED; and at least one mounting socket adapted to mechanically and electrically engage an Edison-mount screw-type light bulb socket, a fluorescent tube coupler arrangement, and a halogen MR-16 socket arrangement, said mounting socket being in electrical communication with said inverter.

21. The lighting apparatus according to claim 20, further comprising:

said first group of semiconductor light emitters being circumferentially spaced apart from one another;

said second group of semiconductor light emitters being circumferentially spaced apart from one another; and said third group of semiconductor light emitters being circumferentially spaced apart from one another; and said first group of semiconductor light emitters being disposed radially outwardly of said second group of semiconductor light emitters and said second group of semiconductor light emitters being disposed radially outwardly of said third group of semiconductor light emitters.

22. The lighting apparatus according to claim 20, further comprising:

said light recycling reflective sheet being a diffusive reflector.

23. The lighting apparatus according to claim 20, further comprising:

said chromaticity tuning member being a separated luminescent sheet positioned in overlying relation to a preselected backscattering light recycling reflector surface;

said set of chromaticity tuning members including reddish orange wavelength conversion sheets, green wavelength conversion sheets, yellow wavelength conversion sheets.

24. A lighting apparatus, comprising:

at least one LED;

a chromaticity tuning cavity;

said chromaticity tuning cavity enclosed by a dome shaped light translucent output window, a reflective annual sidewall and a light redirection reflective member;

a thermally conductive heat sink body adapted to support said chromaticity tuning cavity;

said light translucent window adapted to backscatter at least a portion of LED light;

a plurality of semiconductor light emitters mounted around said interior annual sidewall of said thermally conductive heat sink body;

said plurality of semiconductor light emitters including at least two groups of semiconductor light emitters and at least one luminescent material;

a chromaticity tuning member positioned within said cavity, said chromaticity tuning member adapted to absorb a portion of primary LED light and convert it to secondary spectrum light, said secondary spectrum light adapted to slightly shift the chromaticity coordinates of said lighting apparatus;

a set of said chromaticity tuning members adapted to tune the chromaticity of various lighting apparatuses within one quadrangle on a 1931 CIE chromaticity diagram during a manufacturing process;

an inverter disposed internally of said heat sink body and external to said chromaticity tuning cavity, said inverter being in electrical communication with said at least one LED;

at least one mounting socket adapted to mechanically and electrically engage an Edison-mount screw-type light bulb socket, a fluorescent tube coupler arrangement, and a conversional halogen MR-16 socket arrangement; and said mounting socket being in electrical communication with said inverter.

25. The lighting apparatus according to claim 24, further comprising:

said plurality of semiconductor light emitters comprising at least a first group of semiconductor blue light emitters and a second group of reddish orange light emitters; and said at least one luminescent material being yellow phosphor deposited onto said first group of blue light emitters to excite a yellow light.

26. The lighting apparatus according to claim 24, further comprising:

said light redirection reflective member being a diffusive reflector having a convex shape in the center disposed under said plurality of the lighting emitters to redirect the light from said plurality of semiconductor light emitters into a forward light.

27. The lighting apparatus according to claim 24, further comprising:

said chromaticity tuning member being deposited onto an inside surface of said light translucent window;

said chromaticity tuning layer on said light translucent window adapted to absorb primary blue light and convert into a reddish orange light, a green light, or a yellow light, to shift the chromaticity coordinates of said lighting apparatus.

28. The lighting apparatus according to claim 24, further comprising:

said chromaticity tuning member being deposited onto an inside surface of said light translucent window; and said chromaticity tuning member deposited on said light translucent window adapted to adjust the chromaticity coordinates of said lighting apparatus to its original chromaticity over a life time of said lighting apparatus.

* * * * *